US011048309B2

(12) United States Patent
Lin et al.

(10) Patent No.: US 11,048,309 B2
(45) Date of Patent: Jun. 29, 2021

(54) HEAT DISSIPATION MODULE

(71) Applicant: Acer Incorporated, New Taipei (TW)

(72) Inventors: Kuang-Hua Lin, New Taipei (TW);
Cheng-Wen Hsieh, New Taipei (TW);
Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 80 days.

(21) Appl. No.: 16/457,932

(22) Filed: Jun. 29, 2019

(65) Prior Publication Data

US 2020/0004303 A1    Jan. 2, 2020

(30) Foreign Application Priority Data

Jul. 2, 2018 (TW) ................... 107122836

(51) Int. Cl.
*G06F 1/20* (2006.01)
*H01L 23/467* (2006.01)
*H05K 7/20* (2006.01)

(52) U.S. Cl.
CPC ............. *G06F 1/203* (2013.01); *G06F 1/206* (2013.01); *H01L 23/467* (2013.01); *H05K 7/20154* (2013.01); *H05K 7/20209* (2013.01)

(58) Field of Classification Search
CPC ........ F04D 17/16; F04D 25/06; F04D 25/166; F04D 27/002; F04D 29/281; H05K 7/20209; H05K 7/20154; H01L 23/467; G06F 1/203; G06F 1/206
See application file for complete search history.

(56) References Cited

U.S. PATENT DOCUMENTS

| 6,508,621 | B1 * | 1/2003 | Zeighami | F04D 25/166 415/119 |
| 6,591,873 | B1 * | 7/2003 | McNeil | F01D 5/022 141/4 |
| 6,799,942 | B1 * | 10/2004 | Tzeng | F04D 29/542 415/193 |
| 7,083,386 | B2 * | 8/2006 | Horng | F04D 29/30 416/175 |
| 7,182,572 | B2 * | 2/2007 | Yang | F04D 29/325 415/175 |
| 7,445,423 | B2 * | 11/2008 | Ishihara | F04D 19/007 415/193 |
| 7,484,925 | B2 | 2/2009 | Carlson et al. | |

(Continued)

FOREIGN PATENT DOCUMENTS

| CN | 201802664 | 4/2011 |
| CN | 101603508 | 7/2012 |

(Continued)

OTHER PUBLICATIONS

"Search Report of Europe Counterpart Application", dated Nov. 19, 2019, p. 1-p. 9.

*Primary Examiner* — Igor Kershteyn
(74) *Attorney, Agent, or Firm* — JCIPRNET

(57) ABSTRACT

A heat dissipation module including a first fan and a second fan is provided. The first fan has a first hub and a plurality of first fan blades disposed on the first hub. The second fan has a second hub and a plurality of second fan blades disposed on the second hub. Herein the first hub and the second hub are movably connected to each other in an axial direction such that the first fan and the second fan coincide or are separated from each other.

8 Claims, 4 Drawing Sheets

(56) References Cited

U.S. PATENT DOCUMENTS

| | | | |
|---|---|---|---|
| 8,876,499 B2* | 11/2014 | Horng | ................ F04D 25/0613 |
| | | | 417/423.5 |
| 9,080,556 B2 | 7/2015 | Xu | |
| 9,206,808 B2* | 12/2015 | Yuan | ...................... F04D 17/16 |
| 9,897,109 B2 | 2/2018 | Shen | |
| 2005/0106026 A1* | 5/2005 | Oosawa | ................ F04D 29/646 |
| | | | 416/198 R |
| 2017/0363097 A1 | 12/2017 | Lin et al. | |

FOREIGN PATENT DOCUMENTS

| | | |
|---|---|---|
| CN | 102828974 | 12/2012 |
| CN | 103967836 | 8/2014 |
| CN | 105545778 | 5/2016 |
| CN | 105710418 | 6/2016 |
| CN | 205401186 | 7/2016 |
| CN | 205479003 | 8/2016 |
| CN | 205689464 | 11/2016 |
| CN | 107332433 | 11/2017 |
| EP | 2752581 | 7/2014 |
| JP | 2018198251 | 12/2018 |
| TW | 200718870 | 5/2007 |
| TW | I405533 | 8/2013 |
| TW | I558302 | 11/2016 |
| TW | M545290 | 7/2017 |

\* cited by examiner

HEAT DISSIPATION MODULE

CROSS-REFERENCE TO RELATED APPLICATION

This application claims the priority benefit of Taiwan application Ser. No. 107122836, filed on Jul. 2, 2018. The entirety of the above-mentioned patent application is hereby incorporated by reference herein and made a part of this specification.

BACKGROUND OF THE INVENTION

Field of the Invention

The invention relates to a heat dissipation module and particularly relates to a heat dissipation module that has an adjustable form.

Description of Related Art

In response to the trend towards thinness in the consumer electronics market, electronic products such as computers and handheld devices have been developed with the double goal of thinness and high efficiency. However, the goal of thinness and the goal of high efficiency often contradict with each other. During the operation of a high-performance component, a large amount of waste heat is generated inside the electronic product. As a result, it is required to dispose a heat dissipation module to dissipate the heat and cool the component. However, due to the limitation of the thinned volume of the electronic product, it is difficult to obtain the required heat dissipation efficiency with the existing heat dissipation module.

Accordingly, a heat-dissipating fan that has adjustable thickness and combines two sets of motors and two sets of fan blades was developed to this end. When the electronic product operates in a high-power mode, the thickness of the heat-dissipating fan is increased to improve the heat dissipation efficiency, and when the electronic product operates in a low-power mode, the thickness of the heat-dissipating fan is decreased to meet the demand for thinness. However, the existing heat-dissipating fan has a problem of speed matching. When the heat-dissipating fan is accelerated or decelerated, the two sets of fan blades are prone to generate resonance and noise. Besides, since it is required to combine two sets of motors and two sets of fan blades, the existing heat-dissipating fan has issues of complicated structure and high power consumption.

SUMMARY OF THE INVENTION

The invention provides a heat dissipation module that may effectively prevent resonance and noise.

The heat dissipation module of the invention includes a first fan and a second fan. The first fan has a first hub and a plurality of first fan blades disposed on the first hub. The second fan has a second hub and a plurality of second fan blades disposed on the second hub. The first hub and the second hub are movably connected to each other in an axial direction such that the first fan and the second fan coincide or are separated from each other.

Based on the foregoing, in the heat dissipation module of the invention, through thickness adjustment, the first fan blades and the second fan blades are either separated from each other to achieve effects of large air volume, great wind pressure and low noise, or the two sets of fan blades are made to coincide with each other to meet the demand for thinness.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
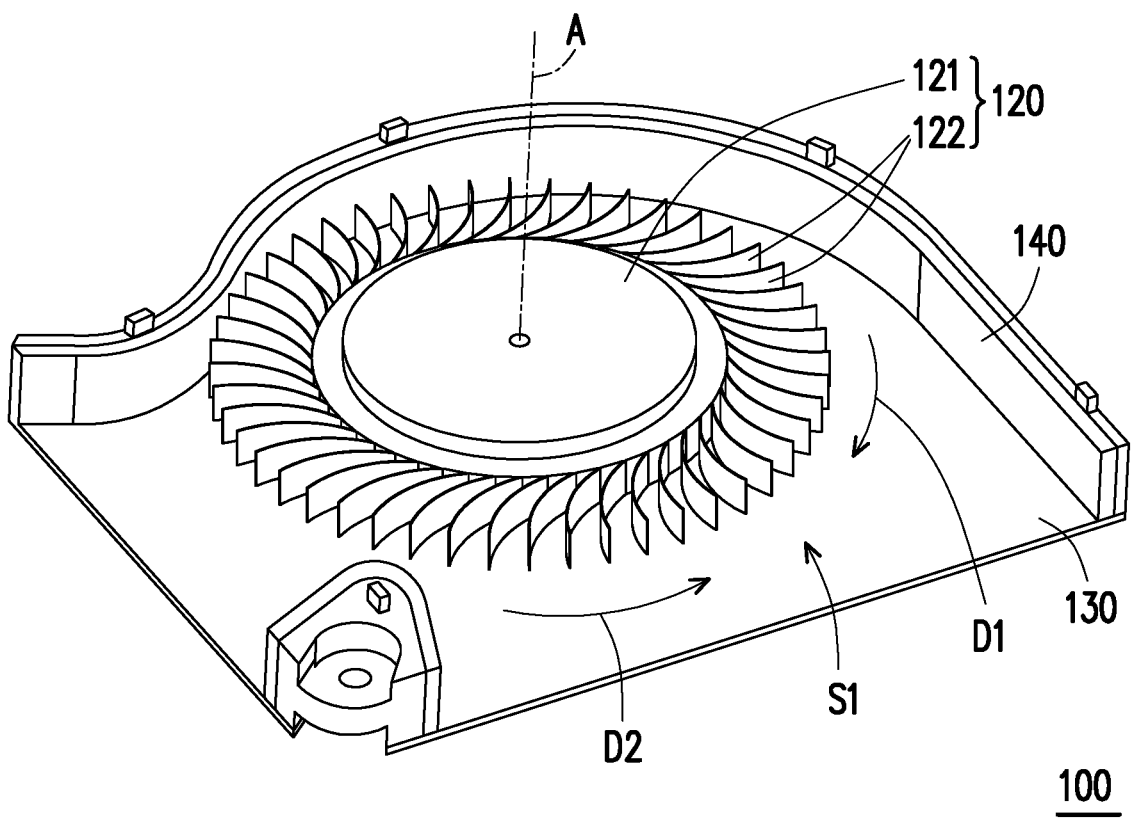
FIG. 1A is a schematic view showing a heat dissipation module in a slim mode according to an embodiment of the invention.
Figure 1B:
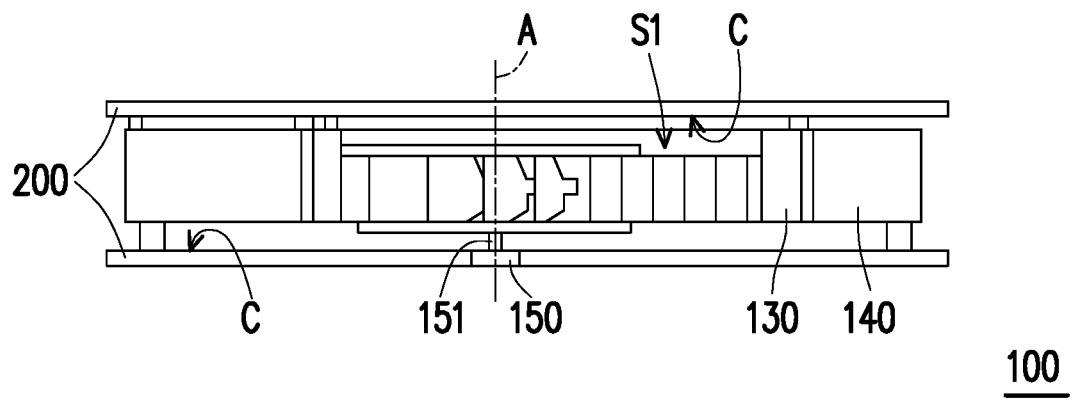
FIG. 1B is a side view of the heat dissipation module of FIG. 1A.
Figure 1C:
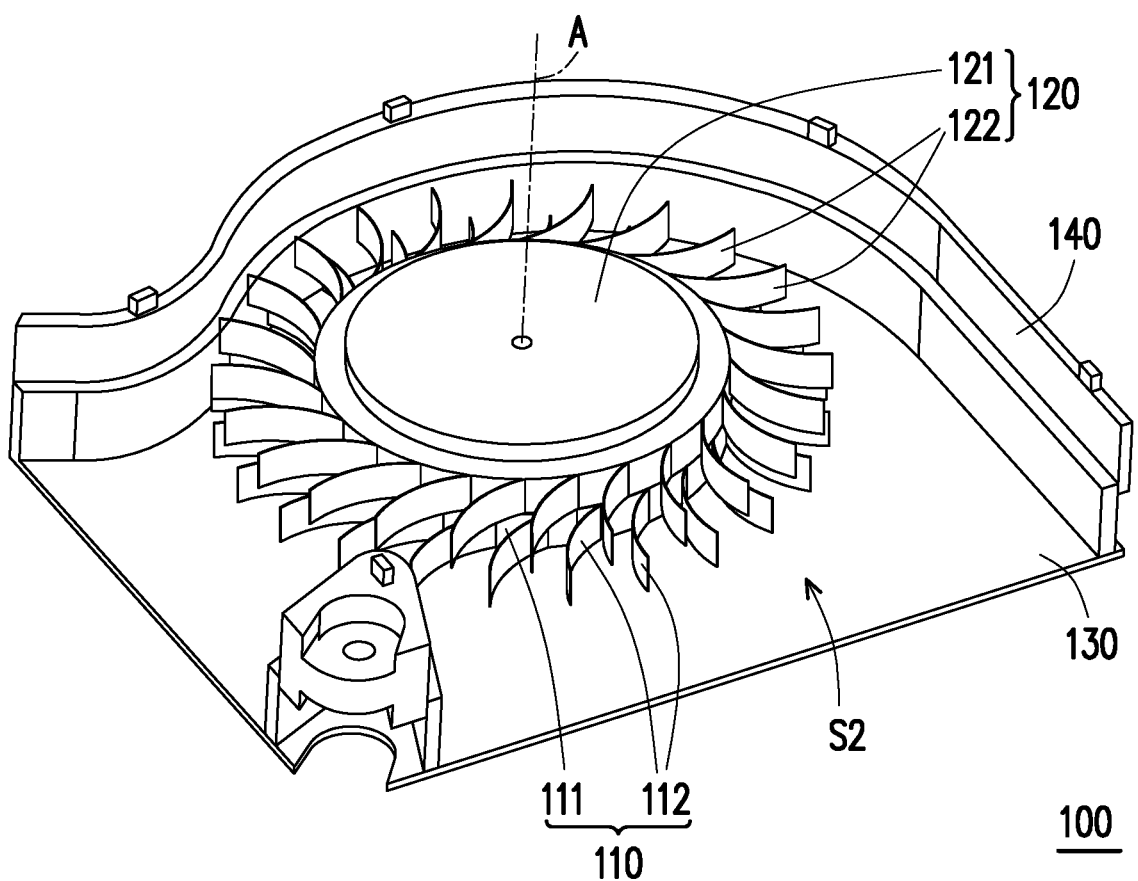
FIG. 1C is a schematic view showing the heat dissipation module of FIG. 1A in a performance mode.
Figure 1D:
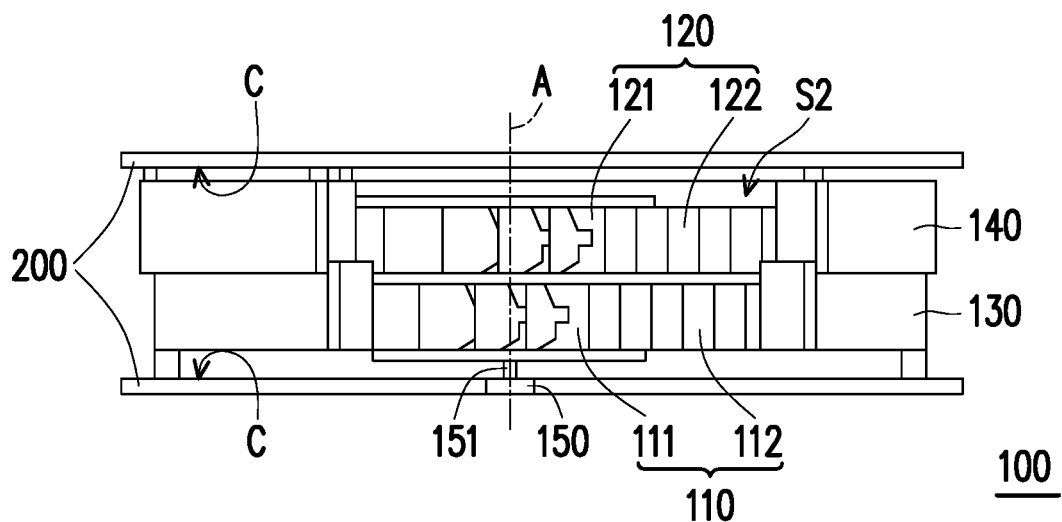
FIG. 1D is a side view of the heat dissipation module of FIG. 1C.

FIG. 1A is a schematic view showing a heat dissipation module in a slim mode according to an embodiment of the invention. FIG. 1B is a side view of the heat dissipation module of FIG. 1A. FIG. 1C is a schematic view showing the heat dissipation module of FIG. 1A in a performance mode. FIG. 1D is a side view of the heat dissipation module of FIG. 1C.

With reference to FIG. 1A to FIG. 1D, a heat dissipation module 100 of the invention is adapted to be disposed in an electronic device (such as a laptop computer or other similar devices) for excluding the waste heat generated inside the electronic device during operation. In this embodiment, the heat dissipation module 100 is, for example, a centrifugal fan, and includes a first fan 110, a second fan 120, a first housing 130 and a second housing 140.

The first fan 110 has a first hub 111 and a plurality of first fan blades 112 circularly disposed on the first hub 111. The second fan 120 has a second hub 121 and a plurality of second fan blades 122 circularly disposed on the second hub 121. The first hub 111 and the second hub 121 are movably connected to each other in an axial direction A such that the first fan 110 and the second fan 120 coincide or are separated from each other. In this embodiment, the plurality of first fan blades 112 disposed on the first hub 111 are misaligned with the plurality of second fan blades 122 disposed on the second hub 121, and an inner diameter of the second hub 121 is greater than an outer diameter of the first hub 111, so that the second hub 121 is sleeved on and covers an outer side of the first hub 111 to accommodate the first hub 111 in the second hub 121.

In this embodiment, materials of the first hub 111 and the second hub 121 may be plastic or metal, and materials of each first fan blade 112 and each second fan blade 120 may be plastic or metal. Therefore, the first hub 111 and the plurality of first fan blades 112 may be integrally formed by injection molding or casting, and the second hub 121 and the plurality of second fan blades 122 may also be integrally formed by injection molding or casting. In other embodiments, the hubs and the fan blades are respectively provided with engaging structures or fastening structures combined correspondingly so as to be assembled and fixed together by means of engaging or fastening.

The second housing 140 is slidably disposed outside the first housing 130, that is, the second housing 140 may be stretched or shrunk in size relative to the first housing 130 in the axial direction A, and the second housing 140 and the first housing 130 have U-shaped appearances and are fitted to each other to form an internal space together. The first fan 110 and the second fan 120 are located in the internal space and are rotatably connected to the first housing 130 and the second housing 140 respectively. In this embodiment, when the first housing 130 coincides with the second housing 140, the height of an internal space S1 is relatively reduced, and the first housing 130 and the second housing 140 respectively drive the first hub 111 and the second hub 121 to coincide with each other in the axial direction A. When the first housing 130 is separated from the second housing 140, the height of an internal space S2 is relatively increased, and the first housing 130 and the second housing 140 respectively drive the first hub 111 and the second hub 121 to be separated from each other in the axial direction A.

FIG. 2A to FIG. 2D are diagrams showing the operational process of the heat dissipation module switched from the slim mode to the performance mode.

Figure 2A:
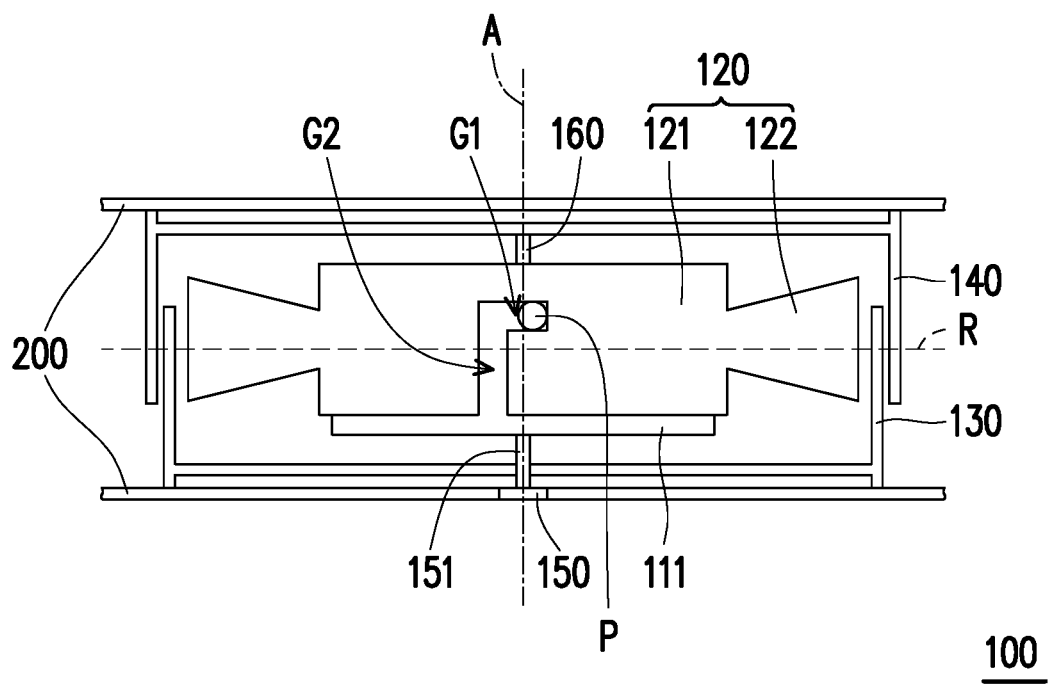
FIG. 2A to FIG. 2D are diagrams showing the operational process of the heat dissipation module switched from the slim mode to the performance mode.

With reference to FIG. 1A, FIG. 1C and FIG. 2A, the invention further includes a motor 150 and a rotation shaft 160. The motor 150 is, for example, a three-phase motor disposed outside the first housing 130, and a rotor 151 of the motor 150 penetrates the first housing 130 in the axial direction A and is connected to the first hub 111. The rotation shaft 160 is rotatably disposed on the second housing 140 and is connected to the second hub 121, so the second housing 140 and the second hub 121 are freely pivoted to each other. The rotation shaft 160 is aligned with the rotor 151 of the motor 150 (both in the axial direction A). Specifically, through the rotor 151, the motor 150 drives the first hub 111 to rotate in a first rotation direction D1 or in a second rotation direction D2. Since the second hub 121 and the first hub 111 are connected to each other, the second hub 121 is driven by the first hub 111 to rotate in the first rotation direction D1 or the second rotation direction D2. Herein the first rotation direction D1 is opposite to the second rotation direction D2.

With reference to FIG. 1B and FIG. 2A, the second hub 121 further includes an engaging groove G1 and a sliding groove G2. The extending direction of the sliding groove G2 is parallel to the axial direction A, and the engaging groove G1 is perpendicular to the axial direction A and communicates with the sliding groove G2. When the first fan 110 and the second fan 120 are driven by the motor 150 to rotate in the first rotation direction D1, a latch P of the first hub 111 is engaged with the engaging groove G1 so that the first hub 111 coincides with the second hub 121, and the plurality of first fan blades 112 and the plurality of second fan blades 122 coincide with each other. The heat dissipation module is thus switched to the slim mode. This mode is adapted for the state in which the electronic device generates less heat.

With reference to FIG. 1D and FIG. 2B to FIG. 2D, when the electronic device is about to produce greater performance output and is expected to generate more heat, the first fan 110 and the second fan 120 are first driven by the motor 150 to rotate in the second rotation direction D2, so that the latch P of the first hub 121 is separated from the engaging groove G1 in a horizontal direction R perpendicular to the axial direction A. Then, the latch P is moved into the sliding groove G2 by the separation of the first housing 130 and the second housing 140, so that the first hub 111 is separated from the second hub 121 along the sliding groove G2. At the same time, the plurality of first fan blades 112 on the first hub 111 and the plurality of second fan blades 122 on the second hub 121 are separated from each other in the axial direction A so that the heat dissipation module is switched to the performance mode.

With reference to FIG. 2A to FIG. 2D, the heat dissipation module 100 of the invention is adapted to be installed in a system body 200 that has adjustable thickness. The first housing 130 and the second housing 140 are respectively fixed on two opposite walls C inside the system body 200. In actual applications, the user applies a force to the system body 200 to adjust the thickness thereof. At the same time, by the system body 200, the first housing 130 and the second housing 140 of the heat dissipation module 100 are driven to engage in a relative movement in the axial direction A. Furthermore, when the thickness of the system body 200 is increased, the two opposite walls C move away from each other in the axial direction A and respectively drive the first housing 130 and the second housing 140 to be separated from each other, thereby increasing the internal space S2 for accommodating the plurality of first fan blades 112 and the plurality of second fan blades 122 after they are separated. In contrast, when the thickness of the system body 200 is decreased, the two opposite walls C move closer to each other in the axial direction A and respectively drive the first housing 130 and the second housing 140 to coincide with each other, thereby decreasing the internal space S1 for accommodating the plurality of first fan blades 112 and the plurality of second fan blades 122 after they coincide.

Besides, the first housing 130 and the second housing 140 are fixed inside the system body 200 by means of engaging, fastening or other methods, for example. However, the invention is not limited thereto.

The operational process of the system body 200 and the heat dissipation module 100 switched from the slim mode to the performance mode is briefly described as follows. With reference to FIG. 2A, when the components inside the system body 200 operate in a low-power state (such as word processing, audio display, and a standby mode), the heat dissipation module 100 only needs to adopt the slim mode. At this time, the thickness of the system body 200 is reduced to a minimum, and the first hub 111 and the second hub 121 coincide with each other, so that each first fan blade 112 and each second fan blade 122 are arranged circularly in equal height. In the slim mode, the heat dissipation module 100 has characteristics of small volume and lesser air intake, and is adapted for the system body 200 that does not generate a large amount of waste heat in the low-power state. The overall thickness of the system body 200 is also reduced to facilitate carrying, storing or placing.

Figure 2B:
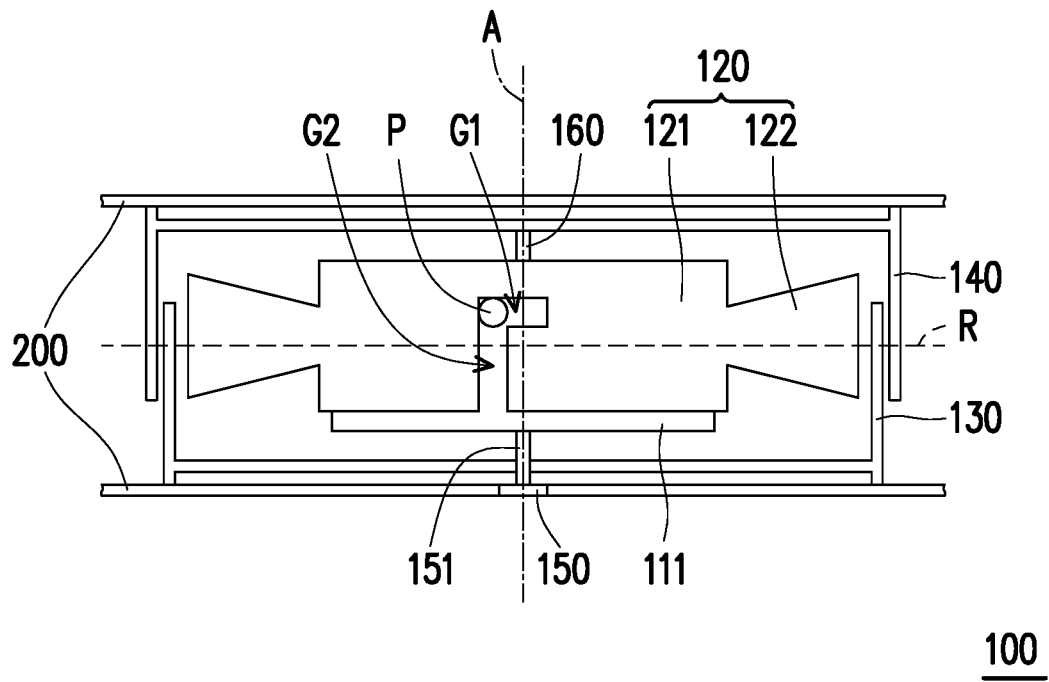
Figure 2C:
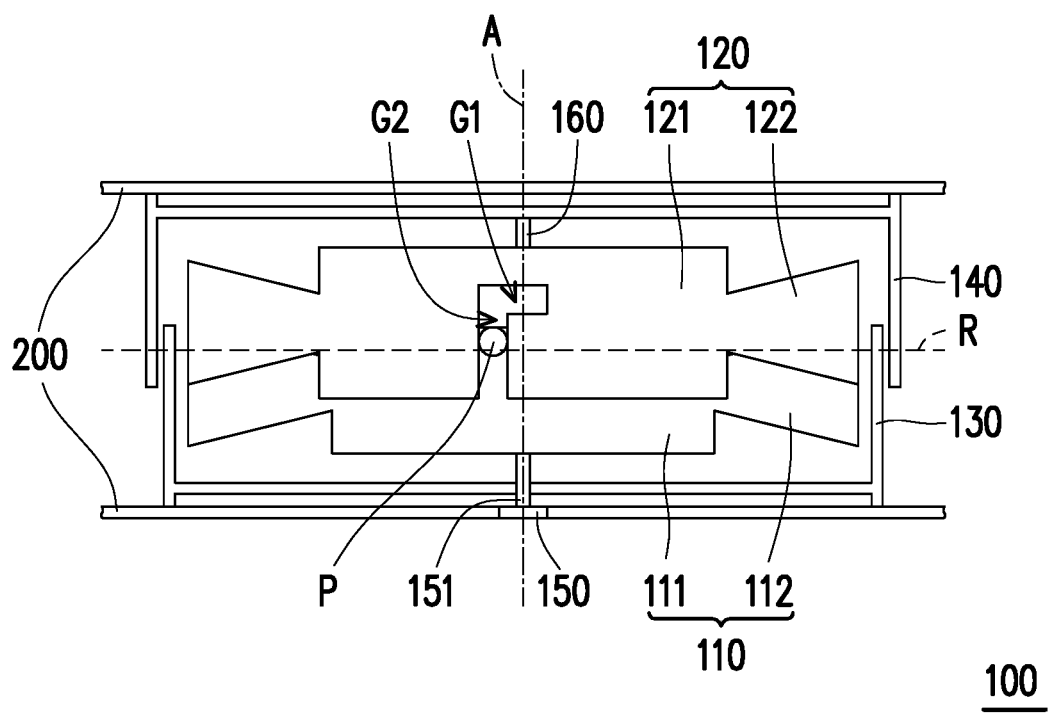
Figure 2D:
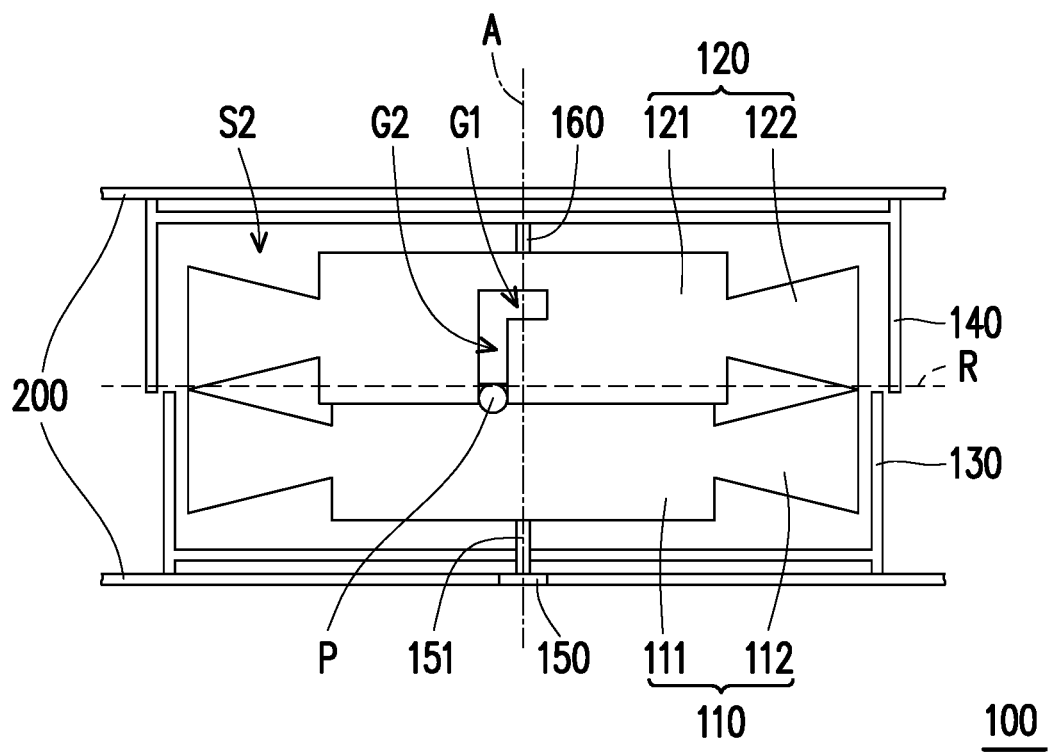

With reference to FIG. 2B to FIG. 2D, when the components inside the system body 200 operate in a high-power state (such as game playing, image processing, and high speed operation), the heat dissipation module 100 needs to adopt the performance mode to improve the heat dissipation efficiency. First, through an external command input, the motor 150 is activated to drive the first fan 110 and the second fan 120 to rotate in the second rotation direction D2, so that the latch P of the first hub 111 is separated from the engaging groove G1 of the second hub 121 in the horizontal direction R to release the engaging state of the first hub 111 and the second hub 121. Then, the user applies a force to the system body 200 such that the two opposite walls C thereof move away from each other to increase the thickness. The two opposite walls C respectively drive the first housing 130 and the second housing 140 to be separated from each other in the axial direction A. At the same time, the first housing 130 and the second housing 140 further pull the first hub 111 and the second hub 121 respectively to move the latch P in the sliding groove G2 in the axial direction A. Finally, the first hub 111 and the second hub 121 respectively drive each first fan blade 112 and each second fan blade 122 to be separated from each other and to be alternatively arranged. In the performance mode, the heat dissipation module 100 has characteristics of large volume and more air intake, and is adapted for the system body 200 that generates a large amount of waste heat in the high-power state, thereby preventing system overheating of the system body 200.

Furthermore, when the heat dissipation module 100 is adjusted to the performance mode, the first fan 110 and the second fan 120 are separated from each other to thicken the heat dissipation module 100. Through the interlacing of the first fan blade 112 and the second fan blade 122 and the configuration of the shape, the air flowing between the plurality of first fan blades 112, after obtaining power, directly enters between the plurality of second fan blades 122 to be pressurized, thereby increasing the transmission speed of the airflow and facilitating airflow circulation and heat dissipation efficiency. In this embodiment, each first fan blade 112 and each second fan blade 122 are the same in shape and number. Besides, by the optimal design, the second fan blade 122 may have rectifying and muting effects with respect to the first fan blade 112 so as to prevent loss of kinetic energy and to fulfill purposes of low noise, high static pressure and high outflow. In other embodiments, each first fan blade and each second fan blade may be configured to different in shape and number according to requirements.

With reference to FIG. 2D to FIG. 2A, the operational process of the system body 200 and the heat dissipation module 100 switched from the performance mode to the slim mode is briefly described as follows. The user applies a force to the system body 200 such that the two opposite walls C thereof move closer to each other to reduce the thickness. The two opposite walls C respectively drive the first housing 130 and the second housing 140 to coincide with each other in the axial direction A. At the same time, the first housing 130 and the second housing 140 further drive the first hub 111 and the second hub 121 respectively to move the latch P in the sliding groove G2 in the axial direction A. Finally, the first hub 111 and the second hub 121 respectively drive each first fan blade 112 and each second fan blade 122 to coincide with each other and cause the latch P to correspond to the engaging groove G1. Then, the motor 150 is activated to drive the first fan 110 and the second fan 120 to rotate in the first rotation direction D1, so that the latch P enters and is engaged with the engaging groove G1 in the horizontal direction R.

In summary, in the heat dissipation module of the invention, through thickness adjustment of the first housing and the second housing, the two sets of fan blades are either separated from each other to achieve effects of large air volume, great wind pressure and low noise, or are made to coincide with each other to meet the demand for thinness. Besides, the invention adopts a single motor to drive the first fan blades and the second fan blades, and may achieve advantages of simple structure and low cost compared with the existing heat dissipation module.

Besides, when the heat dissipation module is applied to an electronic device, the thickness of the heat dissipation module may be adjusted according to the operating power consumption of the electronic device, so that the double purpose of thinness in appearance and heat dissipation performance is achievable.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:
1. A heat dissipation module, comprising:
a first fan, having a first hub and a plurality of first fan blades disposed on the first hub; and
a second fan, having a second hub and a plurality of second fan blades disposed on the second hub, wherein the first hub and the second hub are movably connected to each other in an axial direction such that the first fan and the second fan coincide or are separated from each other, wherein the second hub comprises an engaging groove and a sliding groove, an extending direction of the sliding groove is parallel to the axial direction, and the engaging groove communicates with the sliding groove and is perpendicular to the axial direction.
2. The heat dissipation module as recited in claim 1, further comprising a first housing and a second housing, wherein the second housing is slidably disposed outside the first housing, the second housing and the first housing form an internal space, and the first fan and the second fan are located in the internal space and are rotatably connected to the first housing and the second housing respectively.
3. The heat dissipation module as recited in claim 2, wherein when the first housing coincides with the second housing, a height of the internal space is relatively reduced, and the first housing and the second housing respectively drive the first hub and the second hub to coincide with each other in the axial direction.
4. The heat dissipation module as recited in claim 2, wherein when the first housing is separated from the second housing, a height of the internal space is relatively increased, and the first housing and the second housing respectively drive the first hub and the second hub to be separated from each other in the axial direction.
5. The heat dissipation module as recited in claim 1, further comprising a motor connected to the first hub and adapted to drive the first hub and the second hub to rotate.
6. The heat dissipation module as recited in claim 1, wherein when the first fan and the second fan rotate in a first rotation direction, a latch of the first hub is engaged with the engaging groove so that the first hub coincides with the second hub, and the plurality of first fan blades and the plurality of second fan blades coincide with each other.
7. The heat dissipation module as recited in claim 6, wherein when the first fan and the second fan rotate in a second rotation direction, a latch of the first hub is separated from the engaging groove in a horizontal direction perpendicular to the axial direction and is moved into the sliding groove, so that the first hub is separated from the second hub along the sliding groove, wherein the plurality of first fan blades and the plurality of second fan blades are separated from each other, and the first rotation direction is opposite to the second rotation direction.

8. The heat dissipation module as recited in claim 2, further comprising a rotation shaft rotatably disposed on the second housing and connected to the second hub.

\* \* \* \* \*